United States Patent
Basu et al.

(10) Patent No.: US 7,870,421 B2
(45) Date of Patent: *Jan. 11, 2011

(54) SYSTEMS AND METHODS FOR RECOVERING MEMORY

(75) Inventors: Debashis Basu, San Jose, CA (US); David Ofelt, Menlo Park, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 445 days.

This patent is subject to a terminal disclaimer.

(21) Appl. No.: 12/015,301

(22) Filed: Jan. 16, 2008

(65) Prior Publication Data
US 2008/0133965 A1  Jun. 5, 2008

Related U.S. Application Data

(63) Continuation of application No. 10/947,314, filed on Sep. 23, 2004, now Pat. No. 7,343,513.

(60) Provisional application No. 60/505,110, filed on Sep. 24, 2003.

(51) Int. Cl.
*G06F 11/00* (2006.01)
(52) U.S. Cl. ............................... 714/5; 714/42
(58) Field of Classification Search .................. 714/5, 714/21, 42
See application file for complete search history.

(56) References Cited

U.S. PATENT DOCUMENTS

| | | | |
|---|---|---|---|
| 5,572,697 | A | 11/1996 | Chevalier et al. |
| 5,590,329 | A | 12/1996 | Goodnow et al. |
| 5,689,707 | A | 11/1997 | Donnelly |
| 6,817,011 | B1 | 11/2004 | Reynolds |
| 2004/0168037 | A1 | 8/2004 | Dearth et al. |
| 2005/0028039 | A1 | 2/2005 | Henderson et al. |
| 2007/0136385 | A1 | 6/2007 | Abrashkevich et al. |

OTHER PUBLICATIONS

Debashis Basu et al., co-pending U.S. Appl. No. 10/947,314, filed Sep. 23, 2004, entitled "Systems and Methods for Recovering Memory".

*Primary Examiner*—Marc Duncan
(74) *Attorney, Agent, or Firm*—Harrity & Harrity, LLP

(57) ABSTRACT

A system includes a group of devices and a shared memory that is partitioned into blocks that are capable of being allocated to the group of devices using linked lists. The system also includes check logic configured to store a group of bits, where each bit corresponds to one of the blocks, and counter logic configured to count for a predetermined period of time. The system further includes logic configured to clear the group of bits stored in the check logic, cause the counter logic to count for the predetermined period of time, monitor a de-allocation of the blocks in the shared memory, set, for each of the blocks that is de-allocated during the predetermined period of time, the corresponding bit in the check logic, identify, after the predetermined period of time, one or more bits that have not been set, and mark the blocks corresponding to the one or more bits as available for allocation.

19 Claims, 4 Drawing Sheets

SYSTEMS AND METHODS FOR RECOVERING MEMORY

RELATED APPLICATION

This application claims priority under 35 U.S.C. §119 based on U.S. Provisional Application No. 60/505,110, filed Sep. 24, 2003, the disclosure of which is incorporated in its entirety herein by reference.

FIELD OF THE INVENTION

The present invention relates generally to memory systems and, more particularly, to systems and methods for recovering blocks of memory in a memory system.

BACKGROUND OF THE INVENTION

Linked lists may be used to facilitate the allocation of blocks of memory in a shared memory system to a group of devices. Each device in the group may be associated with a linked list that allows that device to retrieve contiguous or non-contiguous blocks of memory from the memory system or to store data in contiguous or non-contiguous blocks of memory. For example, the linked list may include addresses that indicate that the device is to be allocated blocks 1, 5, 15, 30, and 50 from the memory system. The device may then retrieve data from or store data in block 1, retrieve data from or store data in block 5, retrieve data from or store data in block 15, retrieve data from or store data in block 30, and retrieve data from or store data in block 50.

In some instances, the linked list structure may become corrupt due to, for example, noise or a software error. A corrupt address in a linked list may cause the entire linked list, and corresponding memory blocks, to be lost. Over time, this can contribute to a severe depletion of memory space.

Accordingly, there is a need for systems and methods for recovering lost memory blocks in linked list systems.

SUMMARY OF THE INVENTION

Systems and methods consistent with the principles of the invention address this and other needs by providing techniques for recovering lost memory blocks.

In accordance with the purpose of this invention as embodied and broadly described herein, a method for recovering blocks of memory is provided. The method includes setting bits stored in a first device to a first value, where each bit corresponds to one of a group of blocks in the memory; retrieving a first tail pointer from a list indicating which of the group of blocks is available, where the first tail pointer identifies a last available block of the group of blocks; monitoring a de-allocation of each of the plurality of blocks; setting, for each block of the plurality of blocks that is de-allocated, the corresponding bit in the first device to a second value; detecting allocation of the last available block of the plurality of blocks; and starting a counter, where the counter is configured to count for a predetermined time period. The method further includes reading, after the predetermined time period has elapsed, a second tail pointer associated with each of a group of second devices to which the group of blocks in the memory are capable of being allocated, where each second tail pointer identifies one of the group of blocks; setting bits in the first device corresponding to the blocks identified by the second tail pointers to the second value; determining whether at least one of the bits in the first device has not been set to the second value; and making, when at least one bit has not been set to the second value, the block corresponding to each of the at least one bit available for allocation to the plurality of second devices.

In another implementation consistent with the principles of the invention, a system that includes a group of devices and a shared memory that is partitioned into blocks that are capable of being allocated to the group of devices using linked lists is provided. The system includes check logic configured to store a group of bits, where each bit corresponds to one of the blocks, and counter logic configured to count for a predetermined period of time. The system further includes logic configured to clear the group of bits in the check logic, cause the counter logic to count for the predetermined period of time, monitor a de-allocation of the blocks in the shared memory, set, for each of the blocks that is de-allocated during the predetermined period of time, the corresponding bit in the check logic, identify, after the predetermined period of time, one or more bits that have not been set, and mark the blocks corresponding to the one or more bits as available for allocation.

In yet another implementation consistent with the principles of the invention, a method for recovering lost blocks of memory is provided. The method includes setting bits stored in a first device to a first value, where each bit corresponds to one of a group of blocks in the memory; retrieving a first tail pointer from a list indicating which of the group of blocks is available, where the first tail pointer identifies one available block of the group of blocks; and monitoring a de-allocation of each of the group of blocks. The method further includes setting, for each block of the group of blocks that is de-allocated, the corresponding bit in the first device to a second value; reading, after the one available block identified by the first tail pointer has been allocated, a second tail pointer associated with each of a group of second devices to which the group of blocks in the memory are capable of being allocated, where each second tail pointer identifies one of the group of blocks; setting bits in the first device corresponding to the blocks identified by the second tail pointers to the second value; determining whether at least one of the bits in the first device has not been set to the second value; and making, when at least one bit has not been set to the second value, the block corresponding to each of the at least one bit available for allocation to the group of second devices.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Systems and methods consistent with the principles of the invention recover lost blocks in a shared memory. In an exemplary implementation, a recovery process involves tracking the de-allocation of the blocks of the shared memory during a time period. Any block that has not been de-allocated during that time period may be considered lost (or corrupt). If determined to be lost, the block may be made available for subsequent allocation.

Exemplary System

Figure 1:
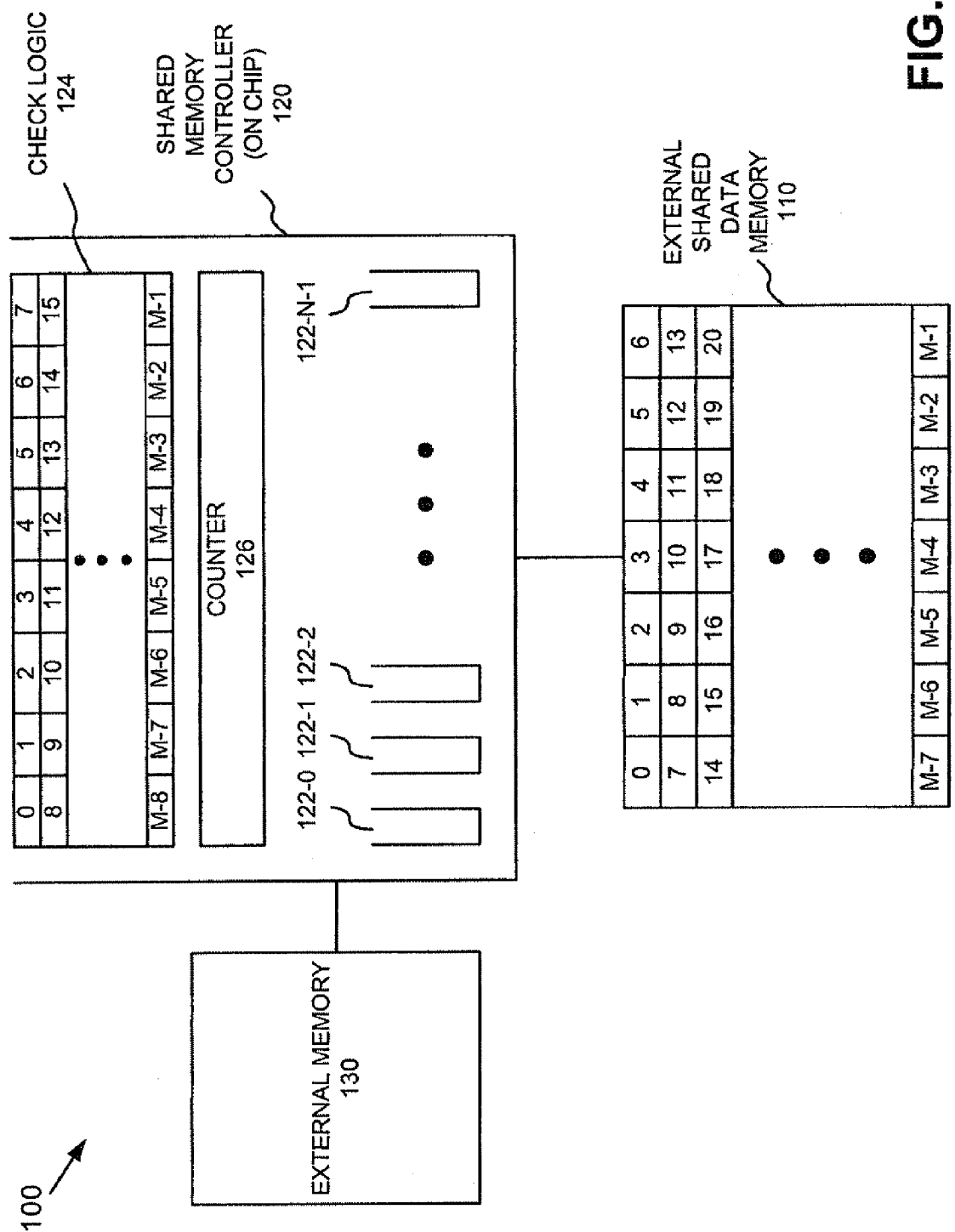
FIG. 1 is an exemplary diagram of a network device in which systems and methods consistent with the principles of the invention may be implemented.

FIG. 1 is an exemplary diagram of a network device 100 in which systems and methods consistent with the principles of the invention may be implemented. As illustrated, network device 100 may include a shared memory 110, a shared memory controller 120, and an external memory 130. It will be appreciated that network device 100 may include other devices (not shown) that aid in receiving, processing, and/or transmitting data.

Shared memory 110 may include an external memory that stores data units (e.g., data cells, packets, etc.) for network device 100. In one implementation, shared memory 110 may include a 256 megabyte (MB) buffer that is partitioned into M blocks (labeled as 0 to M−1), where M is a positive integer that is greater than one. In one implementation consistent with the principles of the invention, M may equal 64,000. The blocks within shared memory 110 may by dynamically allocated.

Shared memory controller 120 may write data units of received data to shared memory 110 and/or read data units from shared memory 110 to transmit it to another networking device. Shared memory controller 120 may include N queues, labeled as 122-0 to 122-N−1 (referred to collectively as queues 122), where N is a positive integer greater than one, check logic 124, and a counter 126. Queues 122 may transfer data units to the blocks in shared memory 110. Each queue 122-0 to 122-N−1 may correspond to a different stream of data units associated with network device 100. In one implementation, shared memory controller 120 may include 288 queues 122. The bandwidth of each queue 122-0 to 122-N−1 may vary. For example, in one implementation consistent with the principles of the invention, the bandwidth through any one queue 122-0 to 122-N−1 may be 1×OC192 (or 10 Giga bits per second (Gbps)), while the bandwidth of the link connecting shared memory controller 120 and external shared memory 110 may be 2×OC192 (or 20 Gbps).

Check logic 124 may store information (e.g., bits) indicating whether the blocks in shared memory 110 are possibly corrupt. Each bit may correspond to one of the blocks in shared memory 110. Check logic 124 may, for example, be maintained as an 8K×8 structure, where each of the 64,000 bits in check logic 124 may correspond to one of the 64,000 blocks in shared memory 110. Each bit may indicate whether the corresponding block in shared memory 110 has been accounted for during the memory recovery process according to the principles of the invention. In one implementation consistent with the principles of the invention, check logic 124 may be implemented as a static random access memory (SRAM).

Counter 126 may include a conventional counter capable of counting for a predetermined time period. In one implementation consistent with the principles of the invention, counter 126 may include a 32-bit or a 48-bit programmable counter capable of counting, for example, up to several minutes (or hours). Counter 126 may be programmed, for example, to a worst-case number indicating how long data may stay in shared memory 110.

External memory 130 may include an off-chip memory that stores linked lists for managing the reading/writing of data units from/to shared memory 110. In another implementation, memory 130 may be located on the same chip as shared memory controller 120.

Figure 2:
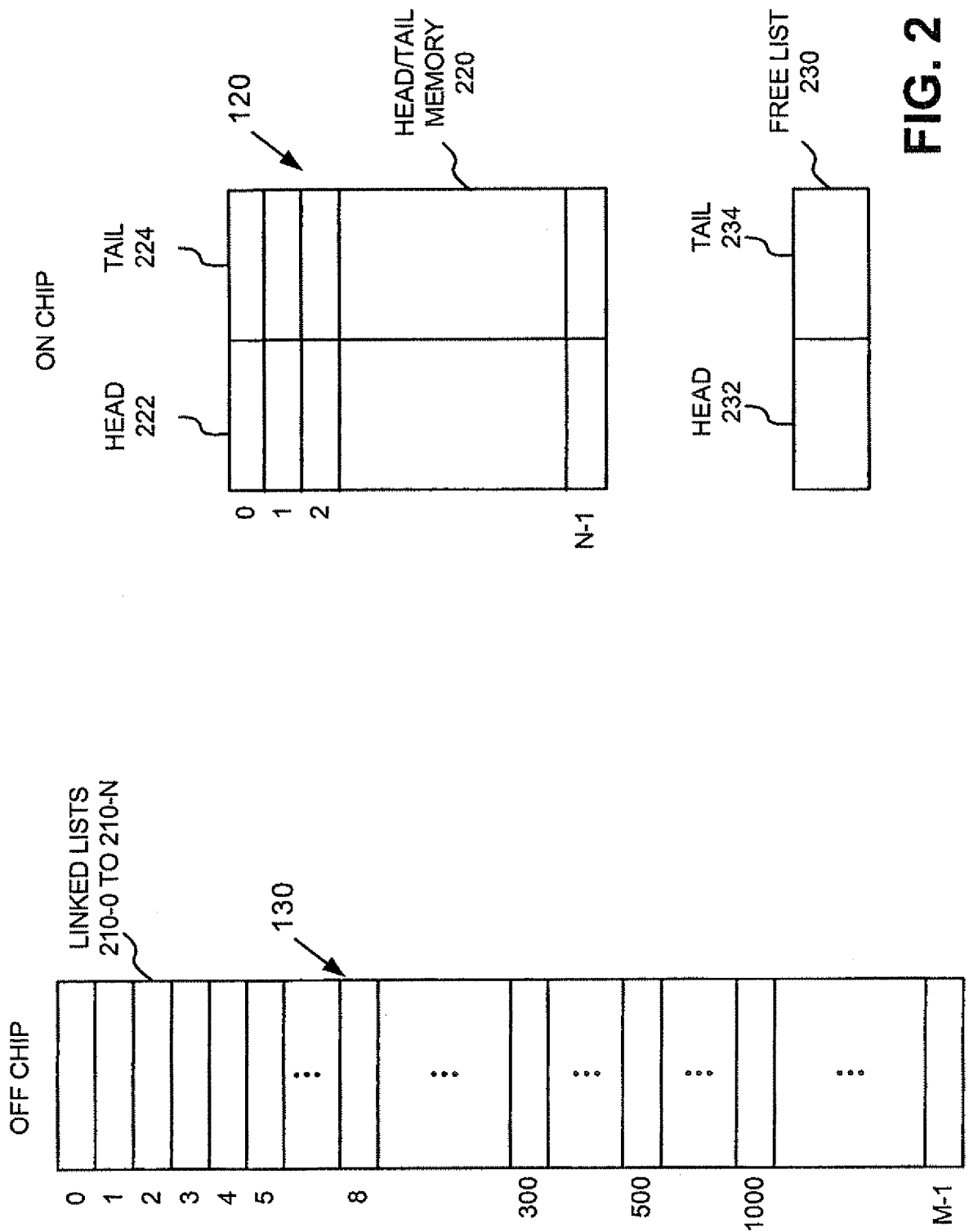
FIG. 2 is an exemplary configuration of the external memory of FIG. 1 in an implementation consistent with the principles of the invention.

FIG. 2 illustrates exemplary data structures that may be located off-chip on external memory 130 and on-chip in shared memory controller 120 in an implementation consistent with the principles of the invention. As illustrated, external memory 130 may include N+1 linked lists, labeled as 210-0 to 210-N (referred to collectively as linked lists 210), where N linked lists correspond to queues 122-0 to 122-N−1, and one linked list is a free list, and shared memory controller 120 may include a head/tail memory 220 and a free list 230.

Linked lists 210 may allow for the dynamic allocation of the blocks in shared memory 110 to queues 122. In one implementation, linked lists 210-0 to 210-N−1 may correspond to queues 122-0 to 122-N−1 and linked list 210-N may correspond to free list 230. For example, a linked list (e.g., linked list 210-0) may indicate a sequence of blocks in shared memory 110 to be allocated to queue 122-0.

Head/tail memory 220 may store a head pointer 222 and a tail pointer 224 to the linked lists 210-0 to 210-N−1 for each of queues 122-0 to 122-N−1. Free list 230 may store information indicating which blocks in shared memory 110 are currently free. In one implementation, free list 230 may store a head pointer 232 and a tail pointer 234 to the linked list (e.g., linked list 210-N) that corresponds to free list 230. Using head pointer 232, tail pointer 234, and linked list 210-N, all free blocks in shared memory 110 may be identified.

Queues 122 are represented logically by linked lists 210-0 to 210-N−1 and tracked by the head/tail pointers in head/tail memory 220. When a new block is allocated to a queue, the new block address becomes the new tail of the queue. The previous tail address location in the corresponding linked list 210-0 to 210-N−1 may be updated by the new block address making it a new entry in the tail of the linked list.

External memory 130 may include other memory devices that aid in dynamically allocating the blocks in shared memory 110 to queues 122. For example, external memory 130 may include a counting device (not shown) that stores a counter for each queue 122-0 to 122-N−1. Each counter may indicate the number of blocks that are in use by the corresponding queue 122-0 to 122-N−1.

Exemplary Processing

Figure 3:
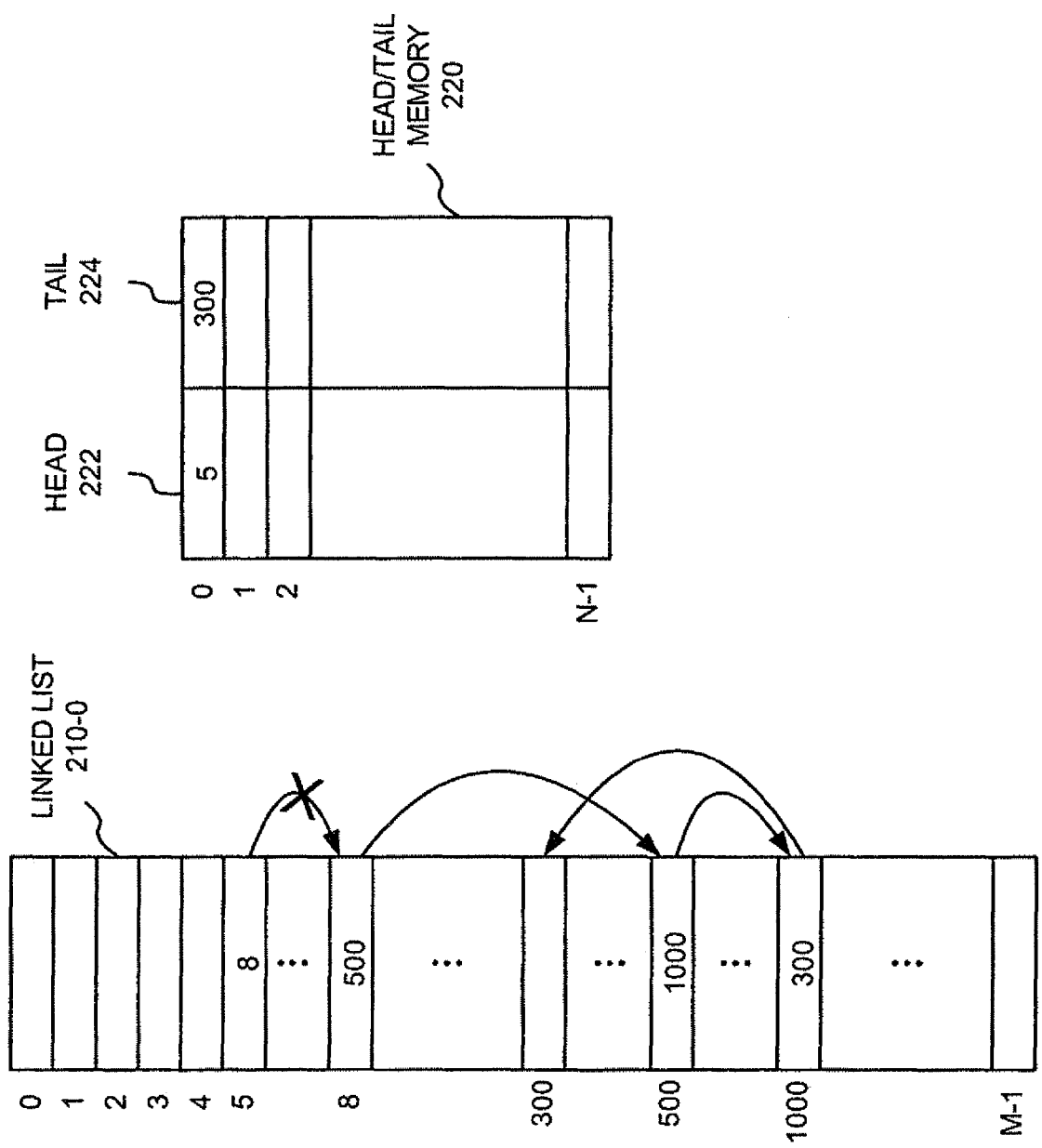
FIG. 3 is a diagram of an exemplary linked list and head/tail memory in an implementation consistent with the principles of the invention.

Instances may exist where one or more of linked lists 210 become corrupt, causing blocks in shared memory 110 to be lost. As an example, assume head pointer 222 from head/tail memory 220 for queue 122-0 indicates that block 5 from shared memory 110 is the next block in use by queue 122-0, as illustrated in FIG. 3. So, in linked list 210-0, which corresponds to queue 122-0, location 5 may include an address pointing to the next block in shared memory 110 to be read out after block 5. Assume, for example, that location 5 of linked list 210-0 points to location 8, location 8 points to location 500, location 500 points to location 1000, and location 1000 points to location 300. Therefore, blocks 8, 500, 1000, and 300 of shared memory 110 would be sequentially read out after block 5 for queue 122-0. Assume further that block 8 of shared memory 110 has become corrupt. Each entry in linked lists 210 has a parity bit. When an entry in the linked list is corrupt, the parity check will indicate the error. For example, block 8 may be determined to be corrupt. The information read from block 8 is not what it is supposed to be (e.g., block 8 should contain a data unit for a particular stream and, when read, contains a data unit for a different stream. If the link is followed, it will send out bad data). In this case, the links to blocks 500, 1000, and 300 may be broken, as illustrated by the "X" in FIG. 3. As such, the blocks following block 8 in the linked list (i.e., blocks 500, 1000, and 300) will be lost and cannot be recovered.

Figure 4:
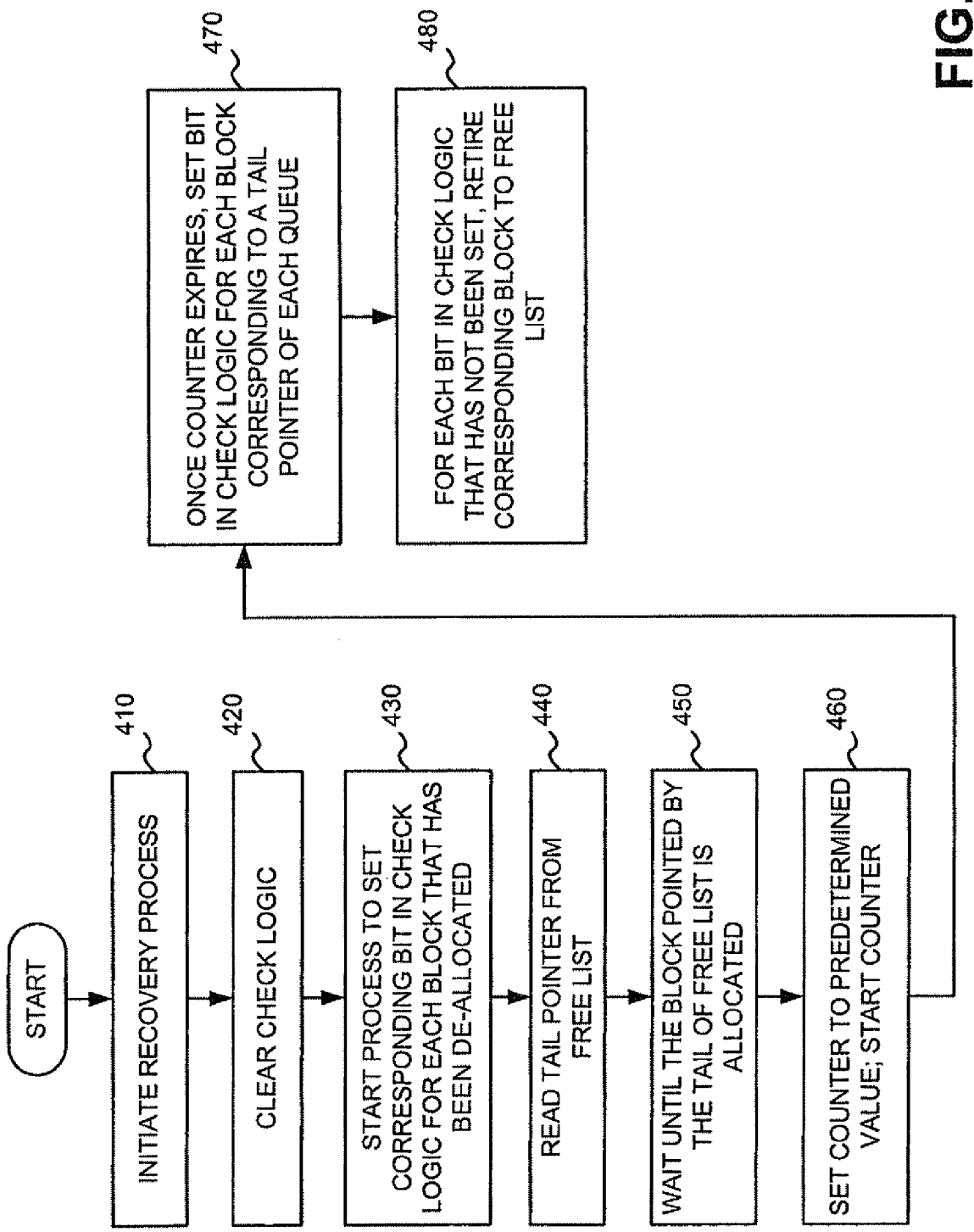
FIG. 4 illustrates an exemplary process for recovering memory blocks in a shared memory in an implementation consistent with the principles of the invention.

FIG. 4 illustrates an exemplary process for recovering memory blocks in shared memory 110 in an implementation consistent with the principles of the invention. The following process may be implemented in software, hardware, or a combination of software and hardware. Processing may begin with the recovery process being initiated (act 410). The recovery process may be initiated automatically (e.g., at a predetermined interval) or manually. The predetermined interval may, for example, be daily, hourly, etc. Alternatively, the recovery process could be run continuously.

Once initiated, shared memory controller 120 may clear check logic 124 by, for example, setting all bits in check logic 124 to zero (act 420). Clearing the bits in check logic 124 indicates that all blocks in shared memory 110 are unaccounted for at the moment that the recovery process is initiated. Shared memory controller 120 may then begin the process of setting bits in the check logic when blocks in shared memory 110 become de-allocated (act 430). During the memory recovery process, blocks in shared memory 110 may be allocated to queues 122 and de-allocated when the information stored in the blocks is later read from shared memory 110. Each time a block in shared memory 110 is de-allocated, shared memory controller 120 may mark the bit in check logic 124 corresponding to the de-allocated block by, for example, setting the bit to one. This indicates that the specific block is not lost due to an error.

Shared memory controller 120 may read tail pointer 234 from free list 230 (act 440). In this way, the end of free list 230 may be determined at the moment that the recovery process is initiated.

Shared memory controller 120 may monitor the blocks of shared memory 110 until the block pointed to by the tail of free list 230 is allocated (act 450). As set forth above, each time a block in shared memory 110 is de-allocated, shared memory controller 120 may mark the bit in check logic 124 corresponding to the de-allocated block by, for example, setting the bit to one. Shared memory controller 120 may continue setting bits in check logic 124 in this manner until the block corresponding to tail pointer 234 from free list 230 has been allocated. The allocation of the block corresponding to tail pointer 234 indicates that all blocks in free list 230 ahead of this block have been allocated to one of queues 122. Therefore, all of the blocks identified by free list 230 will have been accounted for during the memory recovery process.

Shared memory controller 120 may set counter 126 to a configurable, predetermined value (act 460). The predetermined value may represent a significantly long time (e.g., in minutes or hours). In one implementation, the predetermined value may be chosen as large enough to guarantee that all allocated blocks will be de-allocated (unless an error has occurred) and, thus, marked in check logic 124. Counter 126 may then begin counting down from the predetermined value (act 460). During this count-down period, shared memory controller 120 may continue setting a bit in check logic 240 each time a block in shared memory is de-allocated.

Once the counter expires, all blocks in shared memory 110 that were allocated and subsequently de-allocated will have been marked in check logic 124. Any block that is not marked may fall into one of two categories:

(1) A block that is partially used by a queue 122-0 to 122-N−1 (e.g., queue 122-K, where $0 \leq K \leq N-1$). For example, there may be very little traffic flowing through queue 122-K and queue 122-K may be holding onto this block instead of quickly using it and freeing it up as is typically done by queues 122 that are active. These queues will have one block with both the head and tail pointers pointing to it.

(2) A block that is lost due to linked list corruption.

To cover the first category of unmarked blocks, shared memory controller 120 may go through each queue 122-0 to 122-N−1 and set the bit in check logic 124 corresponding to the tail pointers (i.e., tail pointer 224) from head/tail memory 220 for the queue 122-0 to 122-N−1 (act 470). For example, assume tail pointer 224 for queue 122-0 identifies block 300. Shared memory controller 120 would mark the bit in check logic 124 corresponding to block 300 of shared memory 110.

At this point, any bits that are not marked in check logic 124 may be considered as lost due to linked list corruption. Shared memory controller 120 may then retire all unmarked blocks to free list 230 (act 480), making the blocks available for allocation. In one implementation, shared memory controller 120 may sequentially go through bits 0 to M−1 of check logic 124 and retire, for any bit that is not marked (e.g., set to one), the corresponding block from shared memory 110 to the tail of free list 230. In this way, lost blocks in shared memory 110 may be advantageously recovered.

CONCLUSION

Systems and methods consistent with the principles of the invention recover lost blocks in a shared memory. In an exemplary implementation, a recovery process involves tracking the de-allocation of the blocks of the shared memory during a time period. Any block that has not been de-allocated during that time period is considered lost. If determined to be lost, the block may be made available for subsequent allocation.

The foregoing description of exemplary implementations consistent with the principles of the invention provides illustration and description, but is not intended to be exhaustive or to limit the invention to the precise form disclosed. Modifications and variations are possible in light of the above teachings or may be acquired from practice of the invention. For example, while the above description focused on implementing the memory recovery process consistent with the principles of the invention in a network device, it will be appreciated that the memory recovery process may be implemented in any device where memory is allocated/de-allocated using linked lists.

Moreover, instead of waiting for counter 126 to expire and the block corresponding to tail pointer 234 from free list 230 to be allocated and de-allocated prior to examining check logic 124 for lost memory blocks, in another implementation consistent with the principles of the invention, the examination of check logic 124 may be based solely on the expiration of counter 126. In that situation, counter 126 may be set to a value that would likely allow for the block corresponding to tail pointer 234 to be allocated and de-allocated. As another alternative, the examination of check logic 124 for lost memory blocks may be based solely on detecting that the block corresponding to tail pointer 234 has been allocated and de-allocated. In this alternative, counter 126 may not be necessary.

While a series of acts has been described with regard to FIG. 4, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A method comprising:
    tracking de-allocation of blocks of a shared memory during a time period;
    making a block, which has not been de-allocated during the time period, available for storage; and
    storing a data unit in the block after the block has been made available.

2. The method of claim 1, where the making the block available for storage includes:
    storing information corresponding to the block in a list of free blocks.

3. The method of claim 1, where the time period is configurable.

4. The method of claim 1, where the tracking the de-allocation of the blocks of the shared memory is performed using check logic that stores bits corresponding to the blocks of the shared memory, and
    where the method further comprises:
        setting the bits in the check logic to a first value, and
    Where the tracking the de-allocation of the blocks in the shared memory includes:
        setting, for each block that is de-allocated during the time period, the bit that corresponds to the block that is de-allocated to a second, different value.

5. The method of claim 4, where the making the block, which has not been de-allocated during the time period, available for storage includes:
    determining that the block has not been de-allocated during the time period based on the corresponding bit stored in the check logic.

6. The method of claim 1, where the tracking occurs automatically at an interval.

7. The method of claim 1, further comprising:
    reading a tail pointer from a list of free blocks, and
    where the tracking occurs in response to a block of the shared memory, pointed to by the tail pointer, being allocated.

8. A device comprising:
    a shared memory that includes a plurality of blocks for storing data units; and
    a shared memory controller to:
        track de-allocation of the plurality blocks of the shared memory during a time period,
        make a block of the plurality of blocks, which has not been de-allocated during the time period, available for storage, and
        write a data unit to the block after the block has been made available for storage.

9. The device of claim 8, where the shared memory controller includes:
    a plurality of queues, each queue of the plurality of queues corresponding to a different stream associated with the device.

10. The device of claim 8, where the shared memory controller includes:
    a check logic to store bits corresponding to the plurality of blocks of the shared memory, each bit being set to one of a first value that represents that a corresponding block has been allocated or a second value that represents that a corresponding block has been de-allocated.

11. The device of claim 8, where the shared memory controller includes:
    a counter to count for the time period.

12. The device of claim 11, where the time period is configurable.

13. The device of claim 8, where when making the block available for storage, the shared memory controller is configured to:
    store information corresponding to the block in a list of free blocks.

14. The device of claim 8, where the shared memory controller is further configured to:
    read a tail pointer from a list of free blocks, and
    where the shared memory controller tracks de-allocation of the plurality blocks of the shared memory in response to a block of the shared memory, pointed to by the tail pointer, being allocated.

15. A method comprising:
    monitoring a de-allocation of a plurality of blocks in a memory for a time period;
    identifying one or more blocks, of the plurality of blocks in the memory, that have not been de-allocated during the time period;
    marking the one or more blocks as candidates for corruption; and
    retiring the marked one or more blocks to a list of free blocks.

16. The method of claim 15, further comprising:
    reading a tail pointer from a free list that identifies de-allocated blocks in the memory, the tail pointer identifying one available block, and
    where the marking the one or more blocks as candidates for corruption occurs after the one available block has been de-allocated.

17. The method of claim 15, where the monitoring the de-allocation of the plurality of blocks occurs using linked lists.

18. The method of claim 15, where the monitoring the de-allocation of the plurality of blocks in the memory is performed using check logic that stores bits corresponding to the blocks in the memory, and
    where the method further comprises:
        setting the bits in the check logic to a first value, and
    where the monitoring the de-allocation of the plurality of blocks in the memory includes:
        setting, for each block that is de-allocated during the time period, the bit that corresponds to the block that is de-allocated to a second, different value.

19. The method of claim 15, where the monitoring the de-allocation of the plurality of blocks in the memory for the time period, the identifying one or more blocks of the plurality of blocks in the memory that have not been de-allocated during the time period, and the marking the one or more blocks as candidates for corruption occur at an interval.

* * * * *